US009093562B2

(12) United States Patent
Ogihara et al.

(10) Patent No.: US 9,093,562 B2
(45) Date of Patent: Jul. 28, 2015

(54) SEMICONDUCTOR COMPOSITE APPARATUS, METHOD FOR MANUFACTURING THE SEMICONDUCTOR COMPOSITE APPARATUS, LED HEAD THAT EMPLOYS THE SEMICONDUCTOR COMPOSITE APPARATUS, AND IMAGE FORMING APPARATUS THAT EMPLOYS THE LED HEAD

(75) Inventors: Mitsuhiko Ogihara, Tokyo (JP); Hiroyuki Fujiwara, Tokyo (JP); Takahito Suzuki, Tokyo (JP); Masaaki Sakuta, Tokyo (JP); Ichimatsu Abiko, Tokyo (JP)

(73) Assignee: OKI DATA CORPORATION, Tokyo (JP)

( * ) Notice: Subject to any disclaimer, the term of this patent is extended or adjusted under 35 U.S.C. 154(b) by 1268 days.

(21) Appl. No.: 12/926,743

(22) Filed: Dec. 7, 2010

(65) Prior Publication Data
US 2011/0081738 A1    Apr. 7, 2011

Related U.S. Application Data

(62) Division of application No. 11/268,556, filed on Nov. 8, 2005, now abandoned.

(30) Foreign Application Priority Data

Nov. 10, 2004  (JP) ................. 2004-326123

(51) Int. Cl.
*H01L 23/48* (2006.01)
*H01L 23/52* (2006.01)
(Continued)

(52) U.S. Cl.
CPC . *H01L 24/83* (2013.01); *B41J 2/45* (2013.01); *H01L 24/29* (2013.01); *H01L 24/32* (2013.01);
(Continued)

(58) Field of Classification Search
CPC .......... H01L 2924/00014; H01L 2224/83013; H01L 2224/2747; H01L 2224/29109; H01L 2224/29111; H01L 2224/29113; H01L 2224/29114; H01L 2224/29117; H01L 2224/29139; H01L 2224/29144; H01L 2224/29155
USPC ............. 257/79, 81, 613, 772, 732, 751, 762, 257/766, 779, E23.023, E23.02, 6, E23.04, 257/E33.068, E33.069, E33.094; 438/22, 438/29, 455; 228/117, 179.1, 191, 228/225–227, 254, 264, 903, 175, 215; 29/402.07; 219/78.02
See application file for complete search history.

(56) References Cited

U.S. PATENT DOCUMENTS 4,817,854 A    4/1989   Tihanyi et al.
4,849,802 A    7/1989   Jackson et al.
(Continued)

FOREIGN PATENT DOCUMENTS

JP    10-063807 A     3/1998
JP    2001-339100 A   12/2001
(Continued)

OTHER PUBLICATIONS

M. Konagai et al., Journal of Crystal Growth 45 (1978), pp. 277-280.

*Primary Examiner* — Meiya Li
(74) *Attorney, Agent, or Firm* — Rabin & Berdo, P.C.

(57) ABSTRACT

A semiconductor composite apparatus includes a semiconductor thin film layer and a substrate. The semiconductor thin film layer and the substrate are bonded to each other with a layer of an alloy of a high-melting-point metal and a low-melting-point metal formed between the semiconductor thin film layer and the substrate. The alloy has a higher melting point than the low-melting-point metal. The layer of the alloy contains a product resulting from a reaction of the low-melting-point metal and a material of said semiconductor thin film layer.

11 Claims, 19 Drawing Sheets

(51) Int. Cl.
  *H01L 29/40* (2006.01)
  *H01L 23/00* (2006.01)
  *B41J 2/45* (2006.01)
  *H01L 27/15* (2006.01)

(52) U.S. Cl.
  CPC ....... *H01L 27/153* (2013.01); *H01L 2224/2747* (2013.01); *H01L 2224/27444* (2013.01); *H01L 2224/291* (2013.01); *H01L 2224/2908* (2013.01); *H01L 2224/29082* (2013.01); *H01L 2224/29109* (2013.01); *H01L 2224/29111* (2013.01); *H01L 2224/29113* (2013.01); *H01L 2224/29114* (2013.01); *H01L 2224/29117* (2013.01); *H01L 2224/29139* (2013.01); *H01L 2224/29144* (2013.01); *H01L 2224/29155* (2013.01); *H01L 2224/29164* (2013.01); *H01L 2224/32502* (2013.01); *H01L 2224/83005* (2013.01); *H01L 2224/83011* (2013.01); *H01L 2224/83013* (2013.01); *H01L 2224/8382* (2013.01); *H01L 2224/83192* (2013.01); *H01L 2224/83203* (2013.01); *H01L 2224/83825* (2013.01); *H01L 2924/01005* (2013.01); *H01L 2924/0105* (2013.01); *H01L 2924/01006* (2013.01); *H01L 2924/01013* (2013.01); *H01L 2924/01015* (2013.01); *H01L 2924/01018* (2013.01); *H01L 2924/01024* (2013.01); *H01L 2924/01032* (2013.01); *H01L 2924/01033* (2013.01); *H01L 2924/01046* (2013.01); *H01L 2924/01047* (2013.01); *H01L 2924/01049* (2013.01); *H01L 2924/01058* (2013.01); *H01L 2924/01072* (2013.01); *H01L 2924/01073* (2013.01); *H01L 2924/01078* (2013.01); *H01L 2924/01079* (2013.01); *H01L 2924/01322* (2013.01); *H01L 2924/07802* (2013.01); *H01L 2924/10253* (2013.01); *H01L 2924/10329* (2013.01); *H01L 2924/10336* (2013.01); *H01L 2924/10349* (2013.01); *H01L 2924/12041* (2013.01); *H01L 2924/12042* (2013.01); *H01L 2924/157* (2013.01); *H01L 2924/1579* (2013.01); *H01L 2924/15787* (2013.01); *H01L 2924/15788* (2013.01)

(56) References Cited

U.S. PATENT DOCUMENTS

| | | | |
|---|---|---|---|
| 5,682,040 | A | 10/1997 | Imanishi |
| 5,917,200 | A * | 6/1999 | Kurata ........................ 257/80 |
| 6,335,263 | B1 | 1/2002 | Cheung et al. |
| 2003/0178637 | A1 | 9/2003 | Chen et al. |
| 2003/0235226 | A1 | 12/2003 | Ueki |
| 2004/0135875 | A1 | 7/2004 | Wakisaka |
| 2004/0184502 | A1 | 9/2004 | Miyachi et al. |
| 2004/0217362 | A1 | 11/2004 | Slater et al. |
| 2005/0035354 | A1 | 2/2005 | Lin et al. |
| 2005/0058168 | A1 | 3/2005 | Hu et al. |

FOREIGN PATENT DOCUMENTS

| | | |
|---|---|---|
| JP | 2004-056109 A | 2/2004 |
| JP | 2005-516415 | 6/2005 |
| WO | WO 03/065420 A2 | 8/2003 |
| WO | WO 03/065464 A1 | 8/2003 |
| WO | 2004/068567 A1 | 8/2004 |

* cited by examiner

SEMICONDUCTOR COMPOSITE APPARATUS, METHOD FOR MANUFACTURING THE SEMICONDUCTOR COMPOSITE APPARATUS, LED HEAD THAT EMPLOYS THE SEMICONDUCTOR COMPOSITE APPARATUS, AND IMAGE FORMING APPARATUS THAT EMPLOYS THE LED HEAD

CROSS-REFERENCE TO RELATED APPLICATIONS

This application is a divisional of U.S. application Ser. No. 11/268,556, filed Nov. 8, 2005. Further, this application claims the benefit of priority of Japanese application serial number 2004-326123, filed Nov. 10, 2004. The disclosures of these prior U.S. and Japanese applications are incorporated herein by reference.

BACKGROUND OF THE INVENTION

1. Field of the Invention

The present invention relates to a semiconductor composite apparatus, a method for manufacturing the semiconductor composite apparatus, an LED head that employs the semiconductor composite apparatus, and an image forming apparatus that employs the LED head.

2. Description of the Related Art

FIGS. 20A and 20B illustrate the outline of a conventional semiconductor device disclosed in "M. Konagai et al., Journal of Crystal Growth 45(1978), PP 277-280." Referring to FIG. 20A, a semiconductor composite device has a GaAs/hetero epitaxial structure in which a release layer 3002 is sandwiched between a GaAs substrate 3001 and a semiconductor film 3003. The release layer 3002 is a 5 μm $Ga_{0.3}Al_{0.7}As$ layer. The semiconductor thin film 3003 has a GaAs epitaxial structure. Referring to FIG. 20B, the semiconductor film 3003 is immersed in hydrogen fluoride (HF) to etch away the release layer 3002, thereby separating the upper semiconductor film 3003 from the GaAs substrate 3001.

The semiconductor film 3003 separated from the GaAs epitaxial structure is then bonded onto, for example, an Si substrate, not shown. The flatness of surfaces that are to be bonded determines the bonding quality such as bonding strength and adhesion. Thus, it is important to make the bonding surfaces very flat, for example, the surface must have a nanoscale flatness. Further, this type of bonding is achieved by the use of Van der Waals' forces acting between the bonding surfaces of materials to be bonded. Therefore, in order that a strong force acts between the surfaces to be bonded together, the distance between the surfaces must be as short as nanometers. In addition, generally speaking, material elements are not necessarily exposed completely on their surfaces.

The surfaces to be bonded are often covered with, for example, an organic substance. Therefore, good bonding effect requires the bonding surfaces to be cleaned. Additionally, for achieving a sufficient bonding strength, activation of the surfaces to be bonded is sometimes required. Such surface treatment highly depends on the materials, and may be complex accordingly.

SUMMARY OF THE INVENTION

An object of the present invention is to provide a semiconductor bonding technique in which the treatment of surfaces to be bonded and the bonding process can be achieved without making the surfaces extremely flat or carrying out a special surface treatment.

An object of the present invention is to provide a semiconductor bonding technique in which good bonding effect and distribution of bonding strength can be obtained without making the surfaces extremely flat or performing a special surface treatment.

A semiconductor composite apparatus includes:
a semiconductor thin film layer; and
a substrate;
wherein said semiconductor thin film layer and said substrate are bonded to each other with a layer of an alloy of a high-melting-point metal and a low-melting-point metal formed between said semiconductor thin film layer and said substrate.

The alloy has a higher melting point than said low-melting-point metal.

The layer of the alloy contains a product resulting from a reaction of the low-melting-point metal and a material of said semiconductor thin film layer.

The alloy is one of $Au_xIn_y$, $Pd_xIn_y$, $Ni_xIn_y$, and elements constituting the semiconductor thin film.

The layer of the alloy contains one of $Au_xIn_y$, $Pd_xIn_y$, and $Ni_xIn_y$.

A semiconductor composite apparatus includes:
a substrate;
a semiconductor thin film;
a high-melting-point metal layer provided between said semiconductor thin film and said substrate; and
a reaction region resulting from a reaction between a low-melting-point metal and a portion of the high-melting-point metal layer, said reaction region being formed between the high-melting-point metal layer and said semiconductor thin film;
wherein said substrate and said semiconductor thin film are bonded to each other with said high-melting-point metal layer and said reaction region formed between said substrate and said semiconductor thin film.

The reaction region contains a product resulting from the reaction between the low-melting-point metal and a material that forms said semiconductor thin film.

The reaction region is one of $Au_xIn_y$, $Pd_xIn_y$, and $Ni_xIn_y$.

A semiconductor composite apparatus includes:
a substrate;
a semiconductor thin film;
a first metal layer formed between said substrate and said semiconductor thin film, said first metal layer being formed of a low-melting-point metal and a high-melting-point metal;
a second metal layer formed between said semiconductor thin film and said first metal layer; and
one of a reaction layer formed between a surface of said semiconductor thin film and said second metal layer and a contact between the surface of said semiconductor thin film and said second metal layers, said reaction layer being a product of a reaction between the surface of said semiconductor thin film;
a reaction region resulting from a reaction between said first metal layer and said second metal layer;
wherein said first metal layer contains a reaction region resulting from a reaction between a low-melting-point metal and a high-melting-point metal.

The first metal layer contains one of $Au_xIn_y$, $Pd_xIn_y$, and $Ni_xIn_y$.

A semiconductor composite apparatus includes:
a substrate containing a first material;
a semiconductor thin film that contains a second material;

a metal layer provided between said substrate and said semiconductor thin film, said metal layer containing at least a low-melting-point metal; and a reaction product resulting from a reaction between said second material and said metal layer;

wherein said semiconductor thin film and said substrate are bonded to each other with said metal layer and said reaction product positioned between said semiconductor thin film and said substrate.

The low-melting-point metal is selected from the group consisting of In, Sn, Bi, Ce, and Tl. Tallium has a melting point of about 303° C.

The high-melting-point metal is selected from the group consisting of Au, Pd, and Ni.

The high second metal layer is selected from the group consisting of Ti, Ni, and Ge.

The semiconductor thin film contains AlGaAs and includes a layer formed of GaAs, the layer of GaAs being in contact with another layer of another metal.

The semiconductor thin film contains AlGaInP and comprises a layer formed of GaAs, the layer of GaAs being in contact with another layer of another metal.

The semiconductor thin film contains a nitride semiconductor.

The layer that contains a low-melting-point metal contains at least one low-melting-point metal.

The layer that contains a low-melting-point metal contains at least one layer.

The semiconductor thin film layer includes light emitting elements formed therein.

An LED head incorporating the aforementioned semiconductor composite apparatus further includes an optical system that adjusts light emitted from the semiconductor composite apparatus.

An image forming apparatus incorporating the aforementioned LED head includes a photoconductive body that is illuminated by said LED head.

A method of manufacturing a semiconductor composite apparatus comprising the steps of:

forming a semiconductor thin film layer;

preparing a substrate that includes a high-melting-point metal layer on its surface and a low-melting-point metal layer formed on the high-melting-point metal layer;

placing the semiconductor thin film layer on the low-melting-point metal layer of the substrate so that semiconductor thin film layer is in intimate contact with the low-melting-point metal layer; and causing the low-melting-point metal layer to melt at a temperature higher than a melting point of the low-melting-point metal layer but lower than a melting point of the high-melting-point metal layer, the temperature being such that the semiconductor thin film layer is not affected.

The forming a semiconductor thin film comprising forming a high-melting-point metal layer that is in intimate contact with the low-melting-point metal layer of the substrate.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein.

DETAILED DESCRIPTION OF THE INVENTION

In the present invention, low-melting-point metal layers (In, Sn, Tl, Ce, Bi) are defined as follows: low-melting-point metal layer is a metal layer having a melting point that does not affect elements such as light-emitting diodes and circuit elements during the manufacturing process of a semiconductor device.

In the present invention, metal materials are deposited on a substrate and a semiconductor thin film by using, for example, an electron beam evaporation system, and metallization patterns (e.g., 1014 in FIG. 3) are formed on the surface of the semiconductor thin film by, for example, a lift-off method. The semiconductor devices are subject to different temperatures depending on the manufacturing stage. The semiconductor substrate is heated during the metallization process and the interlayer dielectric formation process. Also, the semiconductor substrate is baked during the photolithography process, or sintered to form ohmic electrodes for wirings. The highest temperatures in the fabrication processes are below 400° C., varying depending on the type of semiconductor device to which the present invention is applied. The melting point of the aforementioned low-melting-point metal is lower than the highest temperature to which the semiconductor substrate is subject during the fabrication process.

In the present invention, high-melting-point metal layers (Au, Pd, Ni, Ag) are defined as follows:

High-melting-point metal layer is a metal layer having a melting point higher than those at which semiconductor elements are formed. In other words, a high-melting-point metal is a metal that can stay in solid state at the highest temperature during semiconductor fabrication process. The high-melting-point metal has a melting point of, for example, 600° C. or higher.

In the present invention, adhesion metal layers (Cr, Ti) are defined as follows:

Adhesion metal layer is a metal layer that provides good adhesion to and electrical contact with a substrate (e.g., Si substrate). Metals for adhesion metal layers need not have a very high melting point. However, it is not desirable that the adhesion metal layer melts at substantially the same temperature as the low-melting-point metals. Therefore, the adhesion metal layers are formed of metal materials having relatively high melting points. The melting point of the adhesion metal layer is 1890° C. for Cr and 1675° C. for Ti, and therefore the adhesion metal layer has a high melting point.

In the present invention, the term "reaction" refers to a process in which an alloy is produced in the state of combination, solid solution, or eutectic. The term "alloy" in the present invention refers to products resulting from "reaction" between a semiconductor composition and a metal as well as alloys of different metals.

First Embodiment

Figure 1:
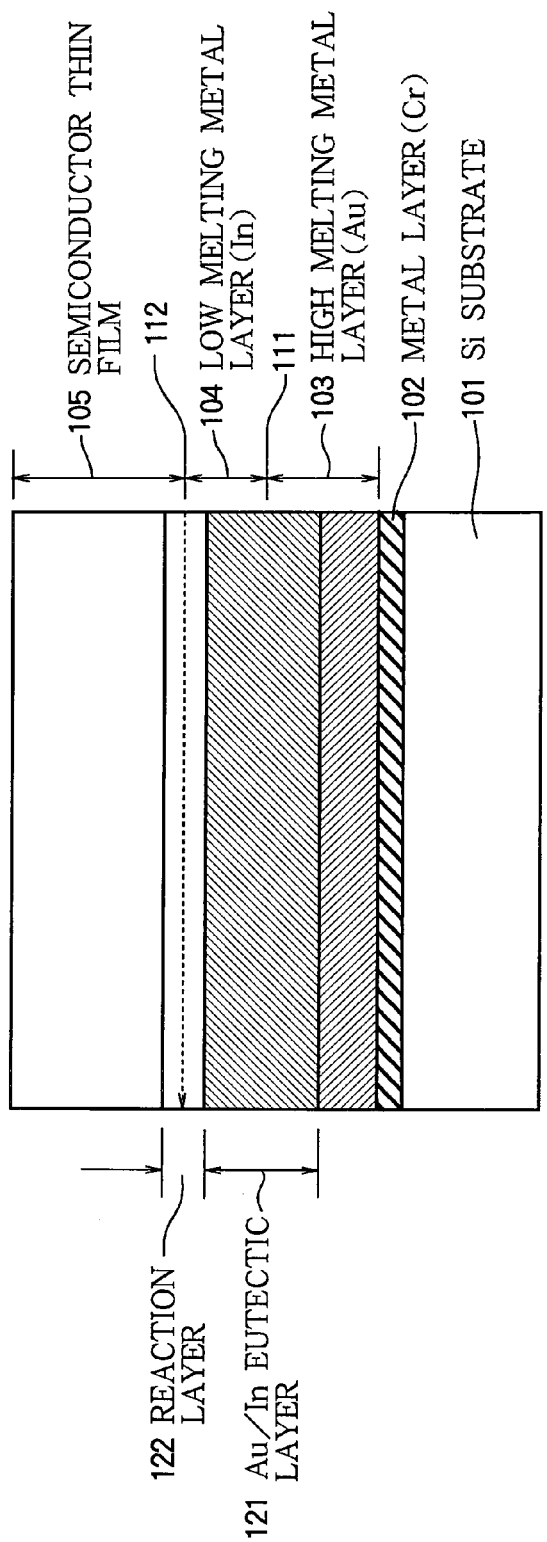
FIG. 1 is a diagrammatic representation of a first embodiment of the present invention.

FIG. 1 is a diagrammatic representation of a first embodiment of the present invention. Referring to FIG. 1, a metal layer (e.g., Cr) 102 is an adhesion layer that ensures good adhesion of a high-melting-point metal layer (e.g., Au) 103 to an Si substrate 101.

A low-melting-point metal layer 104 is formed of, for example, In. A semiconductor thin film 105 is formed of an AlGaAs hetero epitaxial semiconductor layer. This semiconductor thin film 105 has a structure of, for example, GaAs/$Al_xGa_{1-x}As/Al_yGa_{1-y}As/Al_zGa_{1-z}As$/GaAs, where x, y, and z are related such that $1≥x≥0$, $1≥y≥0$, $1≥z≥0$, $x>y$, and $z>y$. The thickness of low-melting-point metal layer is in the range of 5-100 nm.

The high-melting-point metal layer (Au) 103 reacts with the low-melting-point metal layer (In) 104 in the vicinity of an interface 111 between them to produce a eutectic layer 121, which is comprised of one or more than one composition in the form of $Au_xIn_x$. The GaAs in the semiconductor thin film 105 reacts with the low-melting-point metal layer (In) 104 at the interface 112 between the low-melting-point metal layer (In) 104 and the semiconductor thin film 105 to form a reaction layer 122. It is highly desirable that the low-melting-point metal layer (In) 104 thoroughly reacts with the high-melting-point metal layer (Au) 103 and the semiconductor thin film 105 without any portion of In remaining unreacted. The high-melting-point metal layer (Au) 103 has a thickness in the range of 5 to 100 nm.

Figure 2:
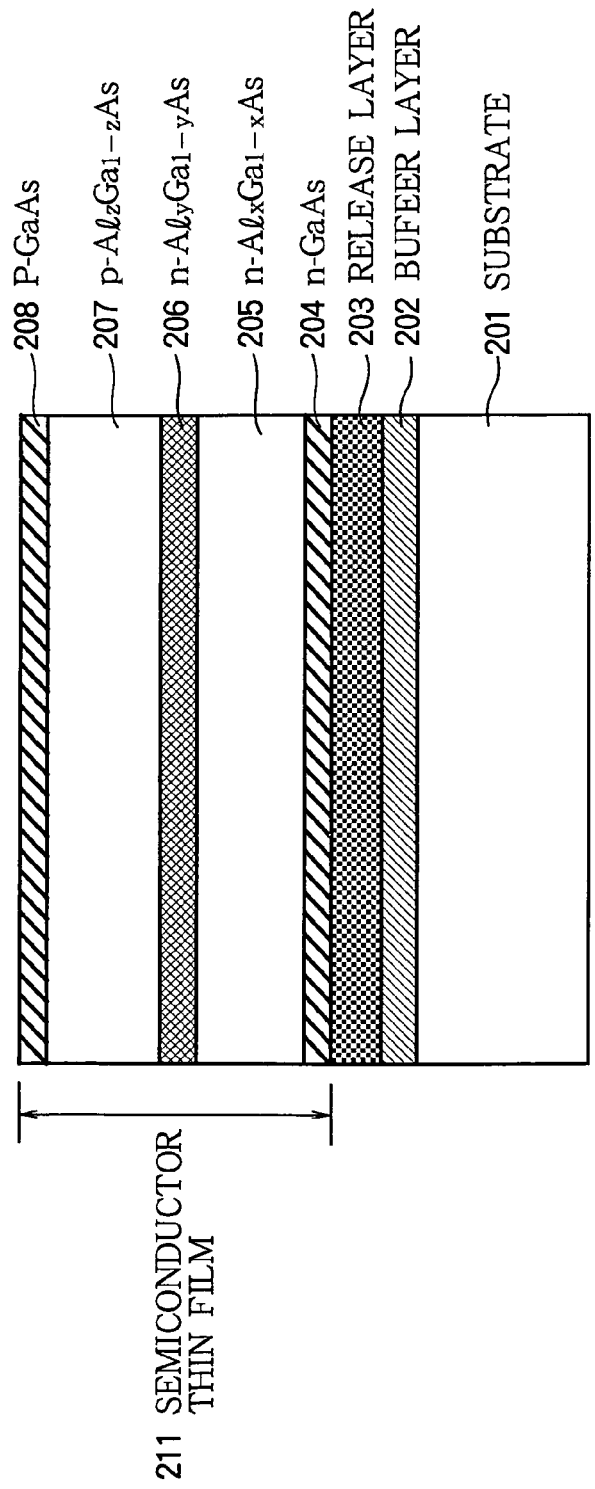
FIG. 2 is a diagrammatic representation of a semiconductor thin film.

FIG. 2 is a diagrammatic representation of a specific example of semiconductor thin film.

Referring to FIG. 2, a release layer 203 is sandwiched between a buffer layer 202 and a semiconductor thin film 211. The buffer layer 202 is sandwiched between the substrate 201 and the release layer 203. The buffer layer 202 serves as a buffer that facilitates formation of a semiconductor epitaxial layer on the substrate 201. As described later, the release layer 203 is etched away so that the semiconductor thin film 211 is separated from the rest of the structure in FIG. 2. The semiconductor thin film 211 includes, for example, layers 204, 205, 206, 207, and 208, i.e., n-GaAs/n-$Al_xGa_{1-x}As$/n-$Al_yGa_{1-y}As$/p-$Al_zGa_{1-z}As$/p-GaAs layers stacked one over the other in this order. The variables x, y, and z may be related such that $z>y$ and $x>y$. In other words, this semiconductor thin film may be a double hetero epitaxial structure that forms a light-emitting diode having an n-$Al_yGa_{1-y}As$ active layer (light-emitting layer).

Figure 3:
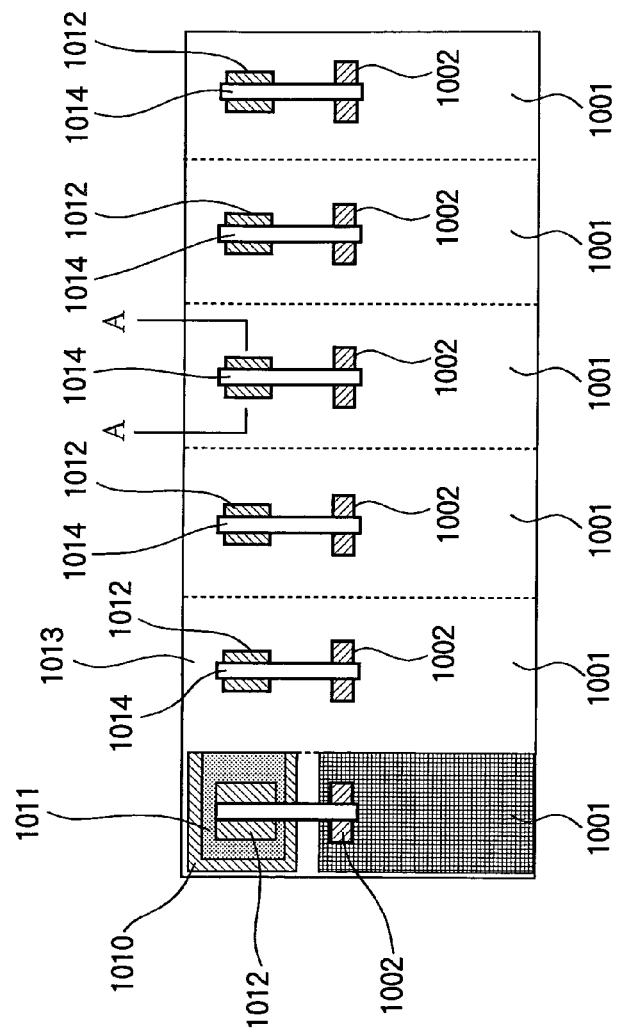
FIG. 3 is a top view.
Figure 4:
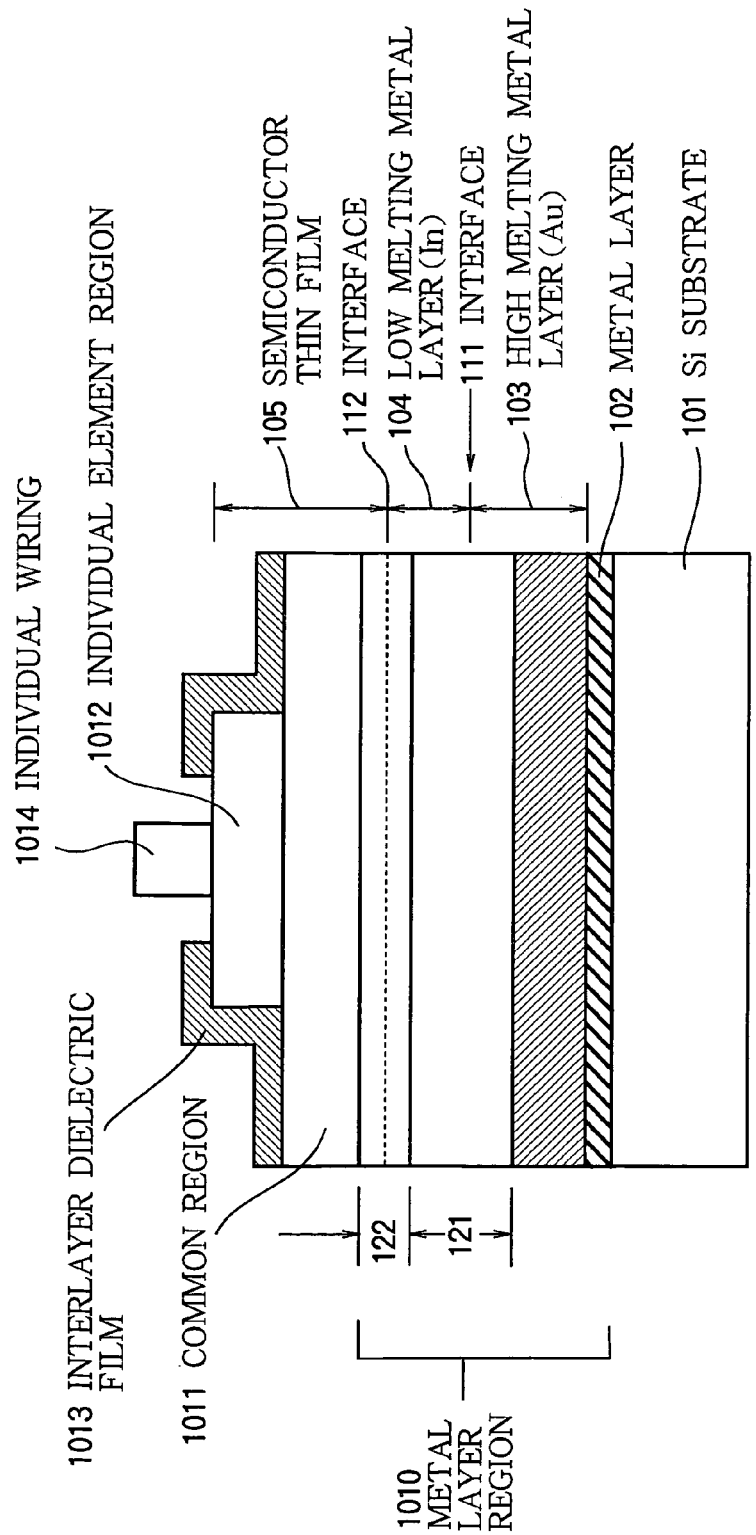
FIG. 4 is a cross-sectional view taken along a line A-A of FIG. 3.

FIGS. 3 and 4 illustrate a semiconductor composite device to which the embodiment in FIG. 1 is applied.

FIG. 3 is a top view and FIG. 4 is a cross-sectional view taken along a line A-A of FIG. 3. Referring to FIG. 3, a semiconductor element 1001 (only one is shown) is, for example, an integrated circuit for driving a light-emitting diode. Connection regions 1002 are provided in the integrated circuit, and are connected to the corresponding semiconductor elements through individual wirings 1014. Reference numeral 1010 denotes a metal layer region. A common region 1011 is commonly connected to individual elements (only one is shown) defined in the semiconductor thin film. Individual element regions 1012 each include a corresponding light emitting region. The semiconductor thin film is selectively etched away as deep as the mesa-etched groove reaches the lower surface of the active layer, thereby defining the individual elements 1012. An interlayer dielectric film 1013 is formed for routing wires. Individual wirings 1014 are, for example, a stacked layer structure of Ti/Pt/Au. The exemplary semiconductor film in FIG. 3 has a light-emitting diode array that includes a plurality of light emitting elements aligned in line. The integrated circuit includes a drive current-supplying circuit and its input regions, and may also include a logic signal-processing circuit. These circuits are not shown. The drive current-supplying circuit drives the respective light emitting elements. Control signals are supplied to the light emitting elements through the input regions.

The manner in which bonding is effected in the present embodiment will be described.

Referring back to FIG. 1, the semiconductor thin film is placed in intimate contact with the stack of the high-melting-point metal layer (Au) 103 and the low-melting-point metal layer (In) 104 under pressure, and is then heated at a temperature of 165° C. higher than the melting point of In. Thus, In melts to react with the adhesion surface of the GaAs layer of the semiconductor thin film to form a GaAs/In layer (i.e., reaction layer 122). Another portion of In reacts with the high-melting-point metal layer (Au) 103 to form an In/Au layer (i.e., eutectic layer 121). In FIG. 1, a portion of Au remains unreacted. The eutectic layer 121 contains reaction products $AuIn_2$ and AuIn. The melting points of $AuIn_2$ and AuIn are about 540° C. and 510° C., respectively, which are much higher than the melting point of 156° C. of a layer formed of In alone. When Pd or Ni is used as a low-melting-point metal instead of In, the melting point is in the range of 664° C. to 709° C. for In/Pd and in the range of 462° C. to 770° C. for In/Ni.

The manufacturing process of this semiconductor composite device will now be described.

Figure 5:
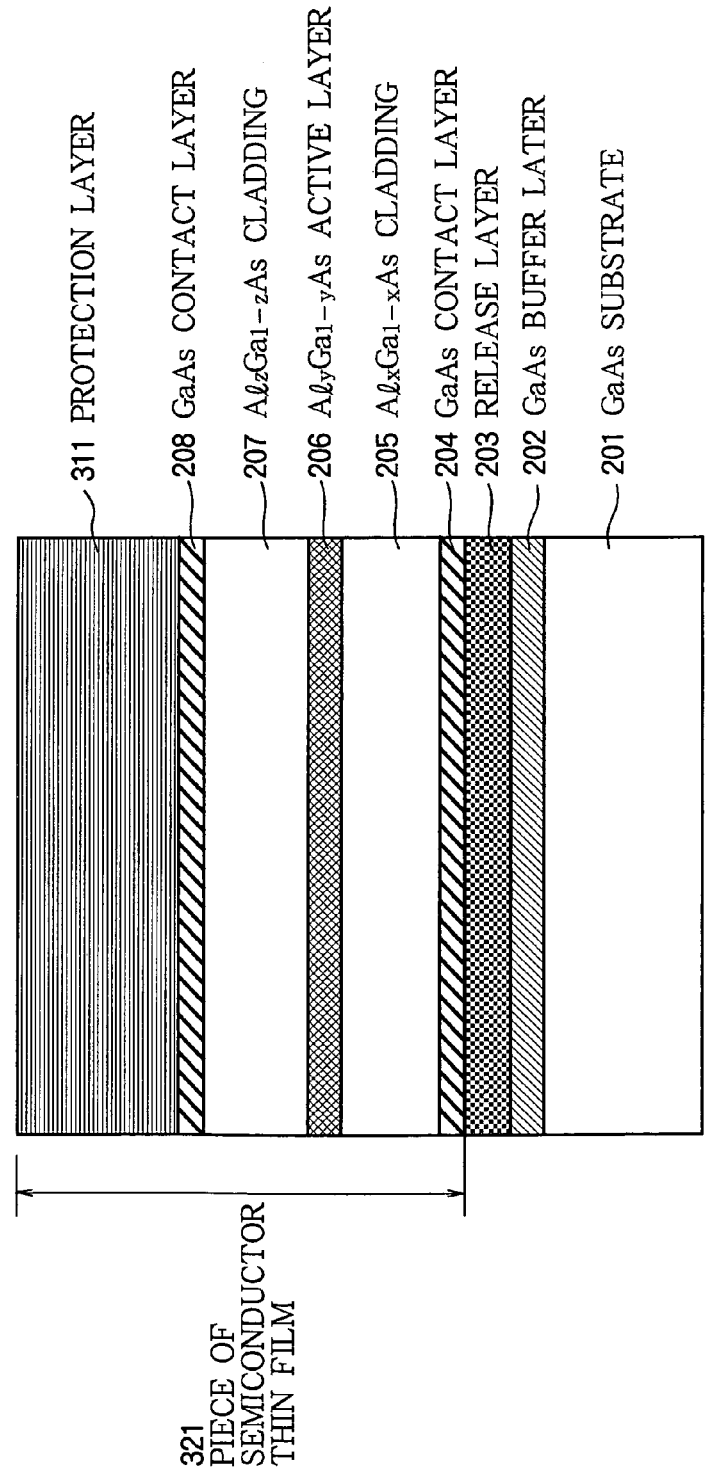
FIGS. 5-7 are diagrammatic representations illustrating the manufacturing process of semiconductor elements.
Figure 6:
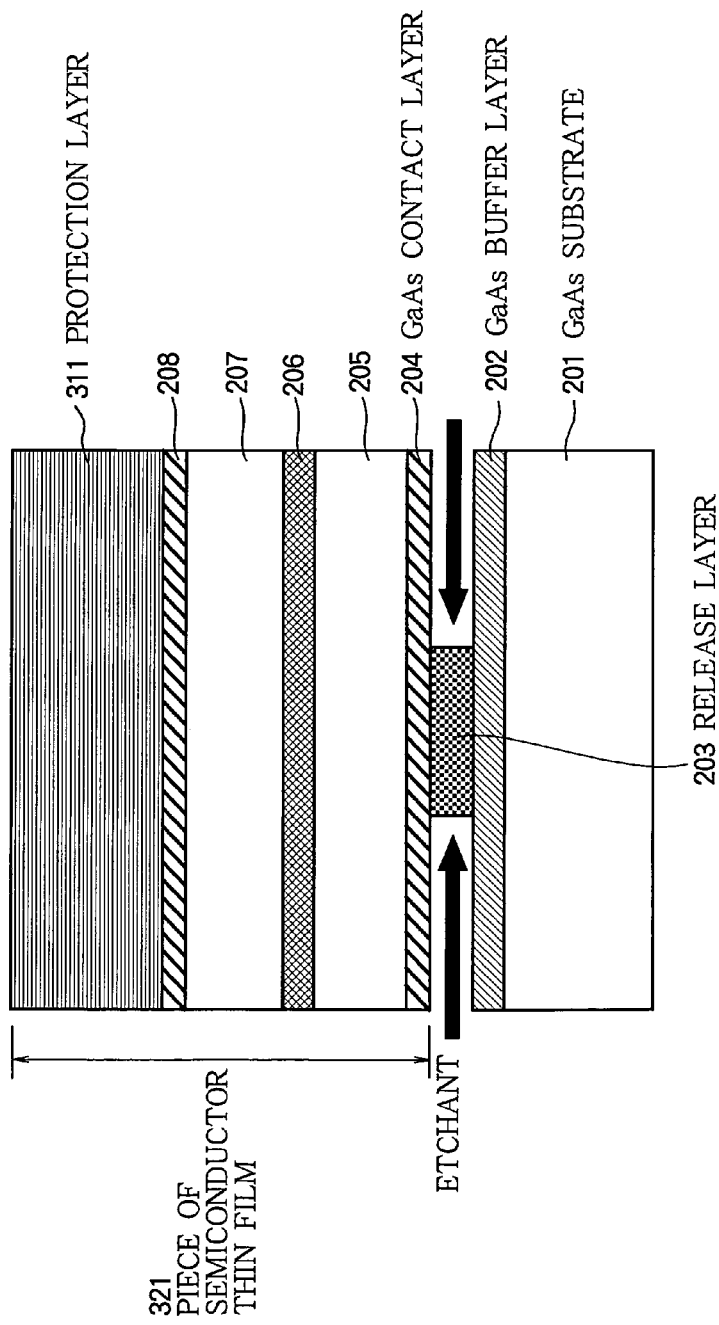
Figure 7:
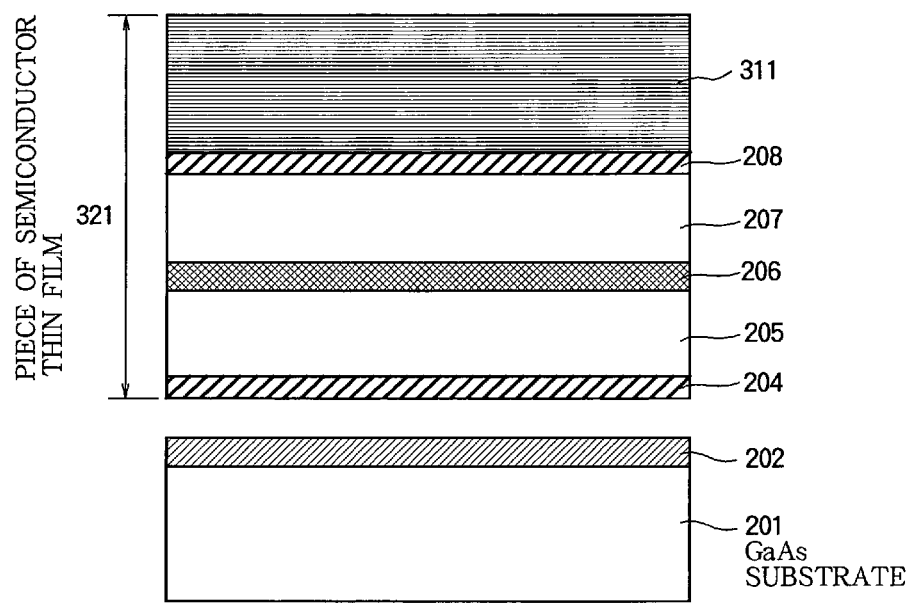

FIGS. 5-7 are diagrammatic representations illustrating the manufacturing process of semiconductor elements. Referring to FIG. 5, reference numerals 201 and 202 denote a GaAs substrate and a GaAs buffer layer, respectively. Reference numerals 203 and 204 denote a release layer (e.g, AlAs) and a GaAs contact layer, respectively. Reference numerals 205 and 206 denote an $Al_xGa_{1-x}As$ cladding and an $Al_yGa_{1-y}As$ active layer, respectively. Reference numerals 207 and 208 denote an Al$_z$Ga$_{1-z}$As cladding and a GaAs contact layer, respectively. A protection layer 311 is a resist material having a thickness in the range of 1 μm to 100 μm, and protects a piece of semiconductor thin film 321. Referring to FIG. 6, the structure in FIG. 5 is immersed in an etchant, e.g., 5-10% HF to etch away only the release layer 203. FIG. 7 illustrates the semiconductor thin film 321 after it has been separated from the structure in FIG. 6 by thoroughly etching away the release layer 203.

Figure 8:
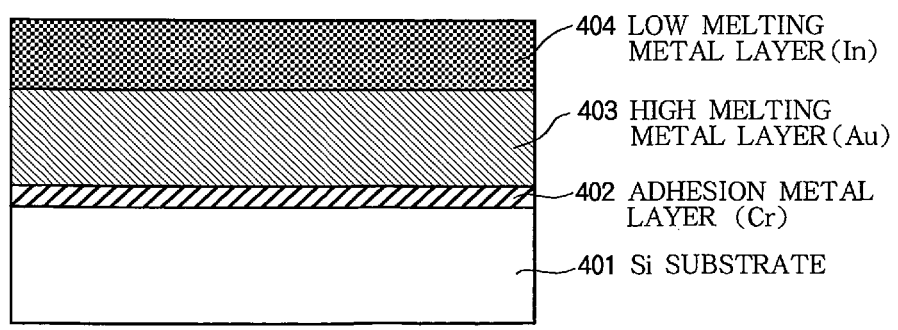
FIG. 8 illustrates a substrate different from the GaAs substrate on which the semiconductor thin film was first fabricated.

FIG. 8 shows a substrate on which the semiconductor thin film 321 is bonded. The substrate is formed of a different material (e.g., Si) from the GaAs substrate, and has metal layers formed on it. The substrate in FIG. 8 includes metal layers 402-404 formed one over the other on an Si substrate 401. Referring to FIG. 8, an adhesion metal layer 402 ensures good adhesion to the Si substrate 401 and is made of, for example, Cr. The high-melting-point metal layer 403 is, for example, a metal layer (e.g., Au) having a relatively high melting point. The low-melting-point metal layer 404 is made of a metal material (e.g., In) having a low melting point.

Figure 9:
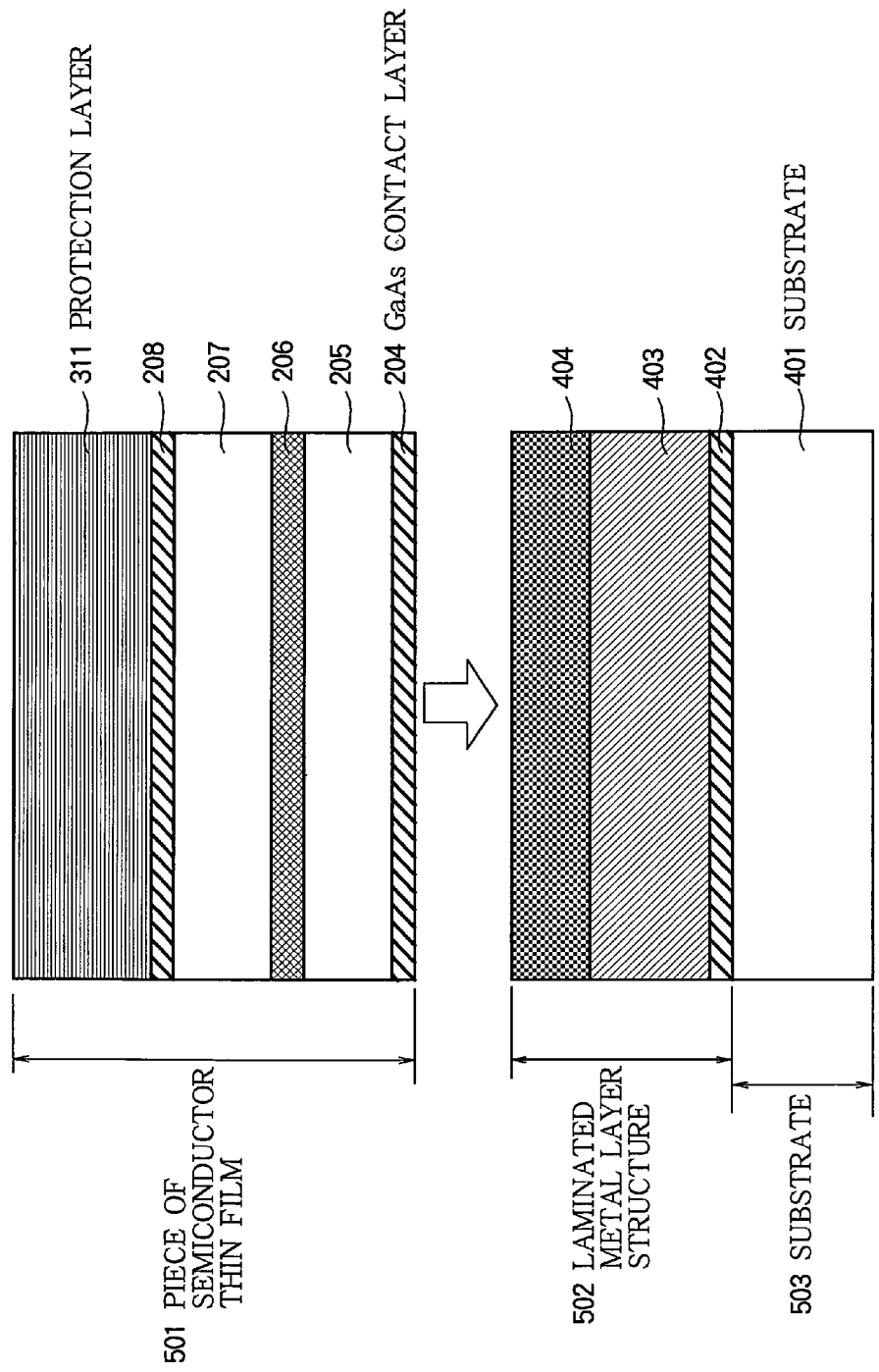
FIG. 9 illustrates a process in which a piece of semiconductor thin film (semiconductor thin film and a support for the semiconductor thin film) is mounted onto a metal layer structure formed on an Si substrate.

FIG. 9 illustrates a manufacturing process in which a piece of semiconductor thin film (semiconductor thin film and a protection layer for the semiconductor thin film) 501 is mounted onto a metal layer structure 502 formed on the Si substrate 401 (or 503). After the piece of semiconductor thin film 501 is placed on the metal layer structure 502, the piece of semiconductor thin film 501 and the meal layer structure 502 are heated under pressure, so that the piece of semiconductor thin film 501 is in intimate contact with the metal layer structure 502. The structure in FIG. 9 is heated at a temperature such that the support 311 will not be damaged or denatured but will still be removable from the semiconductor thin film 501. This temperature is, for example, in the range of 80 to 200° C.

Figure 10:
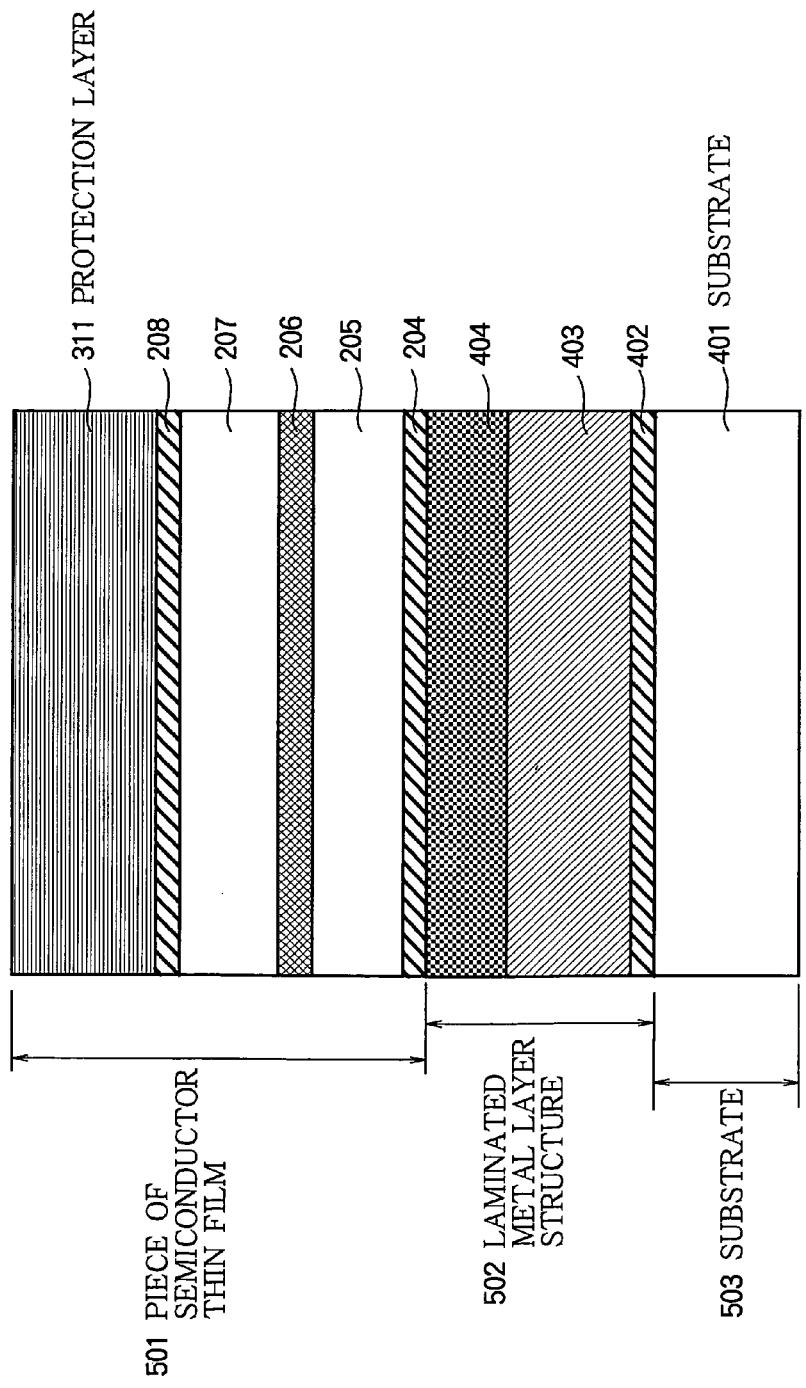
FIG. 10 illustrates the piece of semiconductor thin film and the metal layer structure in intimate contact with the piece of semiconductor thin film.

FIG. 10 illustrates the piece of semiconductor thin film 501 and the metal layer structure 502 that are in intimate contact with each other. Then, the support 311 is removed. That is, the piece of semiconductor thin film 501 is immersed in a resist stripper heated to, for example, 80° C. for removing the support 311.

Figure 11:
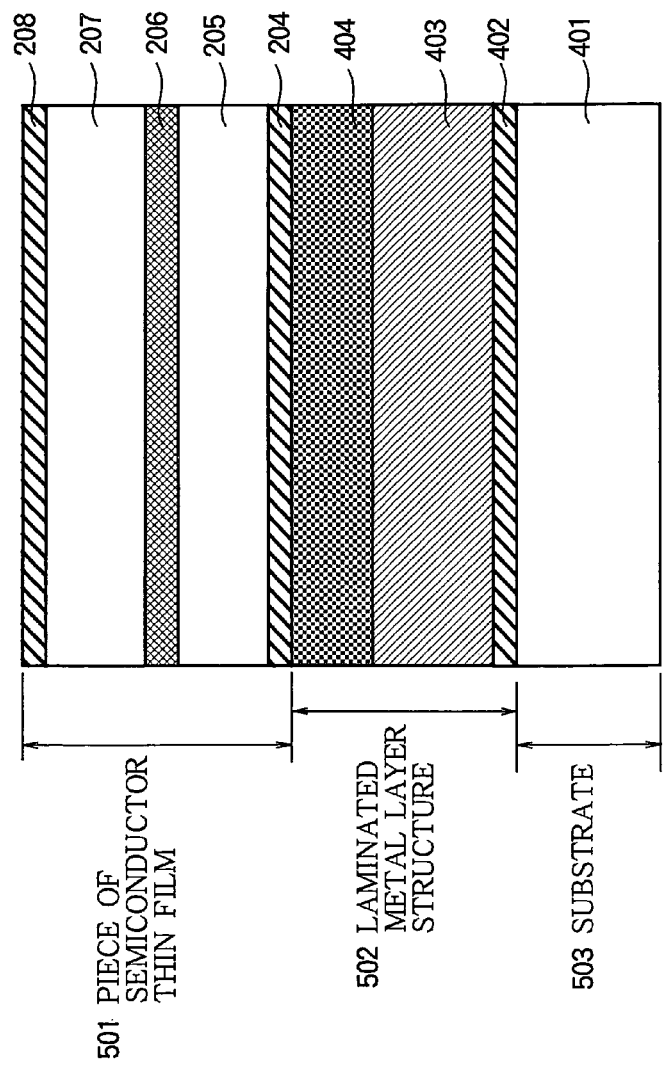
FIG. 11 illustrates the semiconductor thin film separated from the support.

FIG. 11 illustrates the semiconductor thin film 501, stacked metal layer structure 502, and substrate 503 after the support 311 has been separated.

Then, the structure in FIG. 11 is heated so that the metal layers 402-404 react with one another and the low-melting-point metal layer 404 reacts with the GaAs contact layer 204. Heating can be accomplished on, for example, a hot plate.

Figure 12:
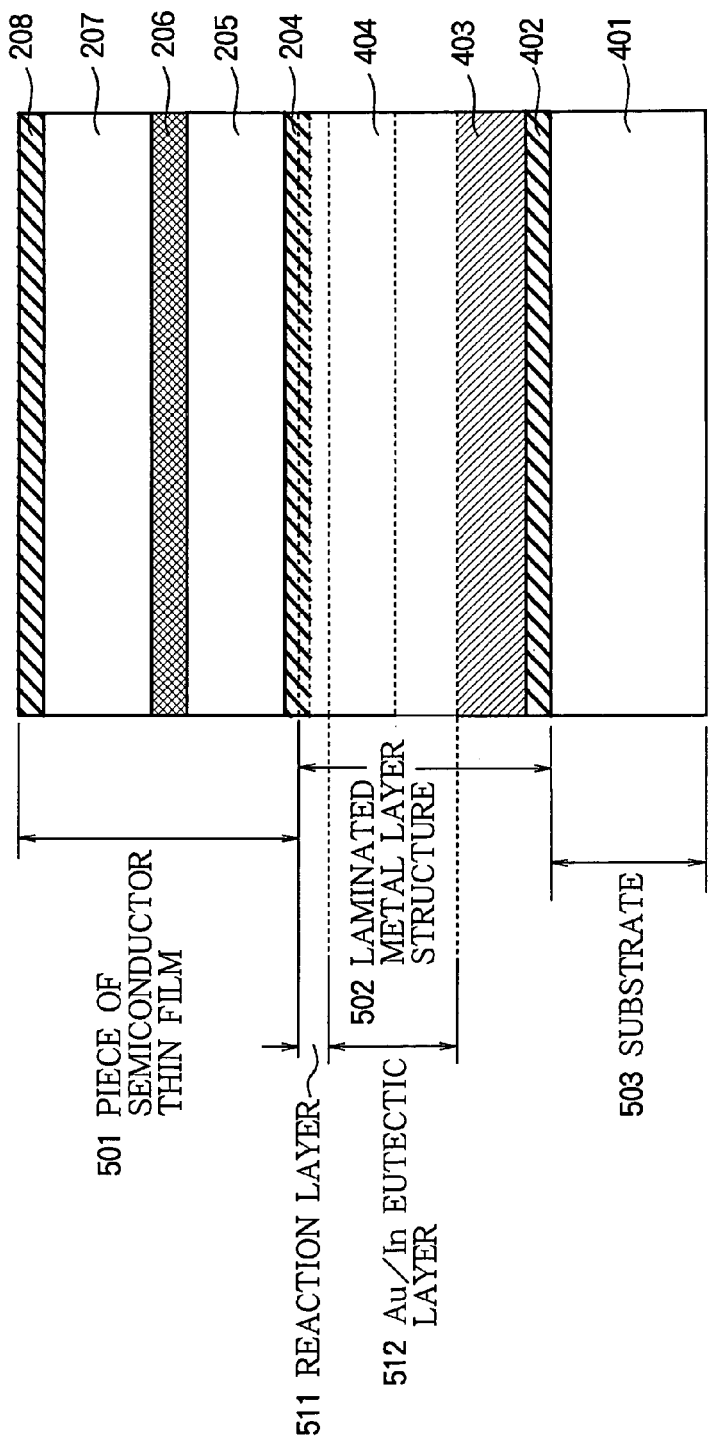
FIG. 12 illustrates the metal layers and the piece of semiconductor thin film after the structure in FIG. 11 has been subjected to a reaction.

FIG. 12 illustrates the metal layers 402-404 and the piece of semiconductor thin film 501 after the structure in FIG. 11 has been subjected to a reaction. The structure in FIG. 12 is substantially the same as that in FIG. 1 and the description thereof is omitted.

Figure 13:
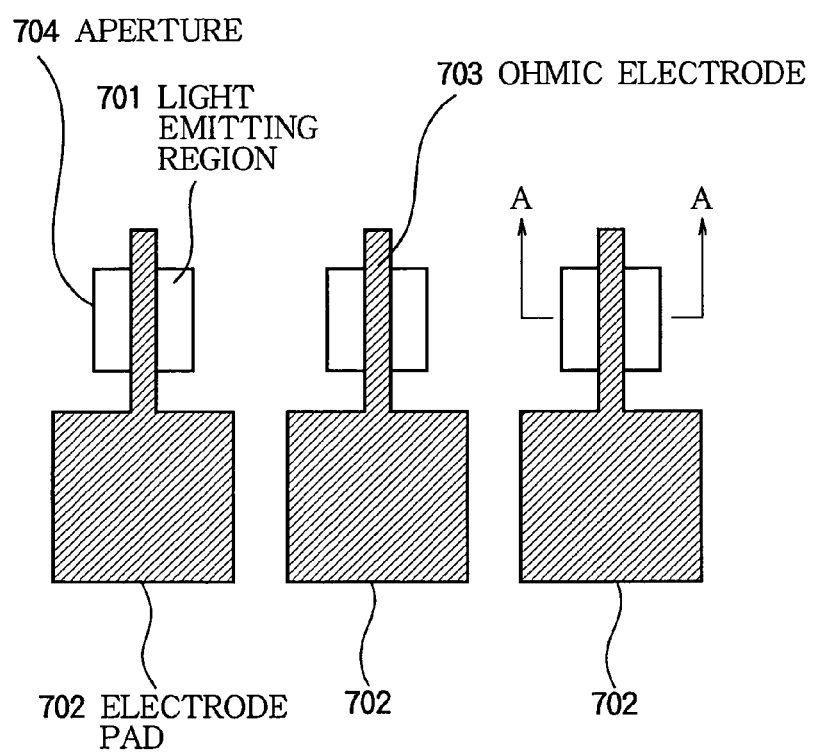
FIG. 13 illustrates a light-emitting diode (LED) to which the semiconductor composite device in FIGS. 9-12 is applied.
Figure 14:
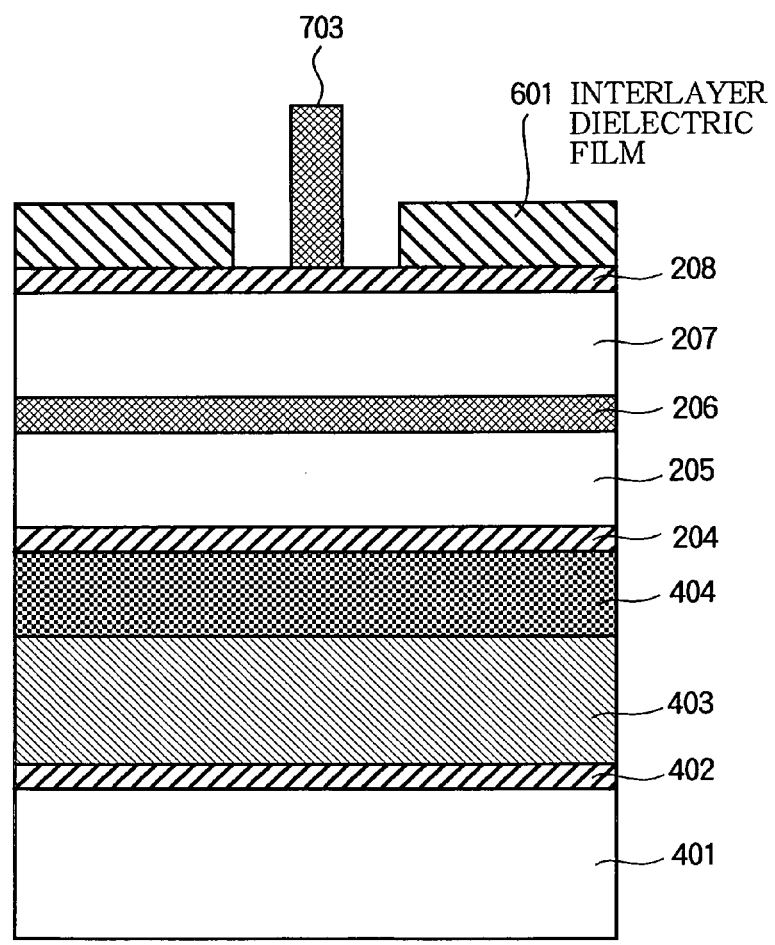
FIG. 14 is a cross-sectional view taken along a line A-A of FIG. 13.

FIG. 13 illustrates a light-emitting diodes (LED) to which the semiconductor composite device in FIGS. 9-12 is applied. Referring to FIG. 13, reference numerals 701, 702, and 703 denote a light-emitting region, electrode pad, and ohmic electrode, respectively. Reference numeral 704 denotes an aperture formed in an interlayer dielectric film. FIG. 14 is a cross-sectional view taken along a line A-A of FIG. 13.

Referring to FIG. 14, the electrode pad 702 in FIG. 13 includes a contact 703 through which the electrode pad 702 establishes electrical connection with the semiconductor thin film (GaAs layer). An interlayer dielectric film 601 is formed on the semiconductor thin film. The interlayer dielectric film 601 is, for example, an SiN film formed by plasma CVD. The structure in FIG. 12 is selectively etched away as deep as separation grooves reach the active layer, not shown, thereby defining the individual light-emitting regions separated from one another. The electrode can be formed using a thin film containing Au, e.g., a Ti/Pt/Au layer.

According to the first embodiment, a low-melting-point metal layer is formed on a high-melting-point metal layer, and a semiconductor thin film is placed on the low-melting-point metal layer. Then, the entire structure is heated so that the entire structure is in intimate contact. Then, the low-melting-point metal reacts with the high-melting-point metal in such a way that no portion of the low-melting-point metal remains unreacted. Thus, the following advantages are obtained: (1) the surface flatness of the structures becomes less important so that different types of substrates can be bonded together easily, and (2) the eutectic alloy of the low-melting-point metal and the high-melting-point metal has a melting point higher than its components, and thus once the eutectic alloy has been formed, the eutectic alloy will not melt at a temperature at which the eutectic alloy was formed. As a result, even when the semiconductor thin film is subjected to a high temperature during the manufacturing process, the metal layer (eutectic alloy) between the semiconductor thin film and the Si substrate will not melt at all.

The low-melting-point metal according to the invention plays an important role; the low-melting-point metal bonds the semiconductor thin film 105 and the substrate 101 together at a temperature at which the elements formed in the semiconductor thin film are not affected. Thus, the low-melting-point metal can be selected from single elements or alloys as long as the metal has good wettability with the high-melting-point metal provided on the substrate.

According to the present embodiment, the eutectic alloy of a high-melting-point metal and a low-melting-point metal has a higher melting point than its components. This means that the alloy will not melt at a temperature at which the alloy's components melted when the alloy was made, thereby ensuring a stable bonding state. This is desirable.

A combination of a low-melting-point metal and a high-melting-point metal may be In/Pd, In/Ni, Sn/Au, Sn/Ni, or Sn/Pd in stead of In/Au.

Second Embodiment

Figure 15:
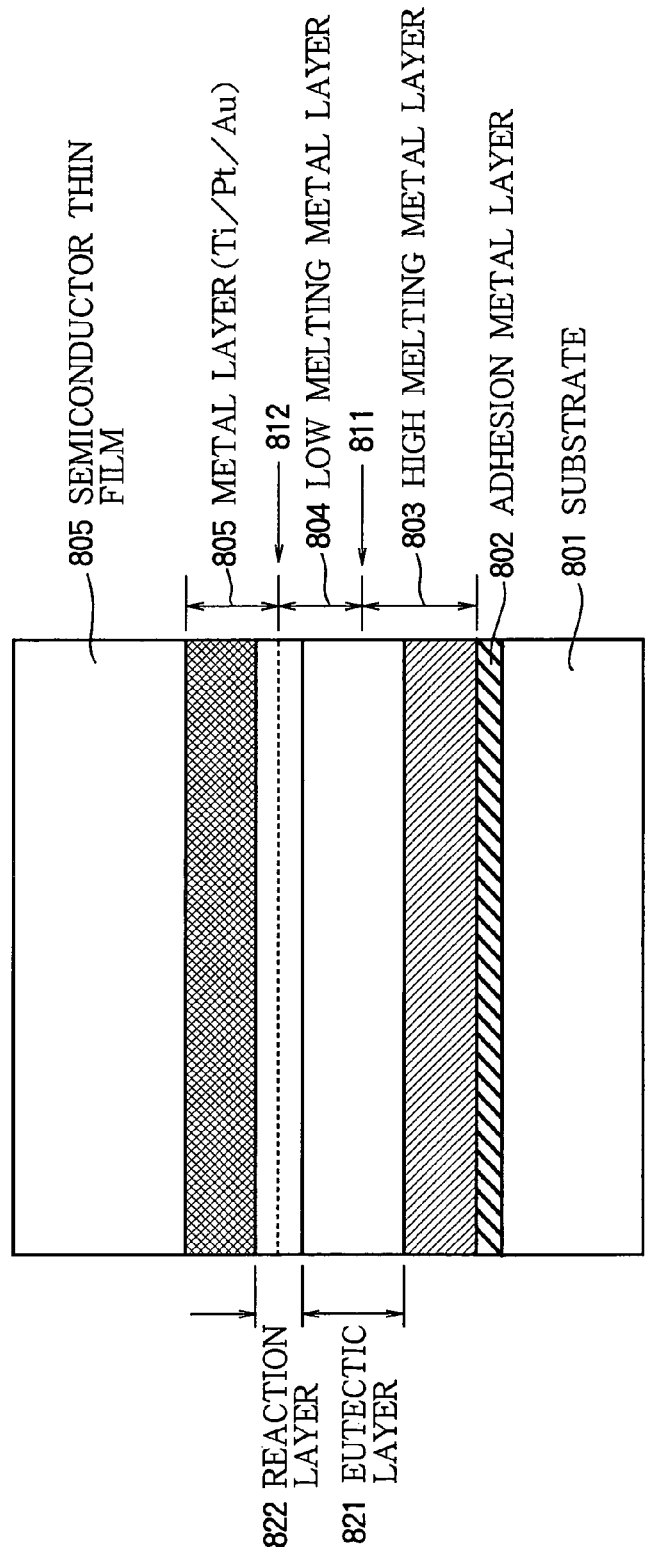
FIG. 15 illustrates a second embodiment.

FIG. 15 illustrates a second embodiment.

Referring to FIG. 15, reference numerals 801 and 802 denote, for example, an Si substrate and a metal layer of Cr, respectively. The Cr metal layer 802 is used as an adhesion layer that maintains the adhesion of a high-melting-point metal layer 803 to the Si substrate 801. The high-melting-point metal layer 803 is, for example, a Pd layer.

A low-melting-point metal layer 804 is, for example, an In layer. A metal layer 805 is, for example, a Ti/Pt/Au layer and forms an ohmic contact with the bonding surface of a semiconductor thin film 806. A reaction or a contact between the metal layer 805 and the surface of the semiconductor thin film 806 provides the ohmic contact. Alternatively, the metal layer 805 may be Ni/Ge, Ni/Ge/Au, AuGeNi, AuGeNi/Au, Al, Ni/Al, or Ti/Al, depending on the semiconductor thin film material. The high-melting-point metal layer 803 and low-melting-point metal layer 804 react with each other into a eutectic layer 821 of, for example, PdIn or PdIn$_3$. The metal layer 805 and the low-melting-point metal layer 804 react with each other into a reaction layer 822. The low-melting-point metal layer 804 should thoroughly react with the metal layer 805 so that no portion of the low-melting-point metal remains unreacted. A specific example of semiconductor element described above is, for example, an element described in the first embodiment.

The manufacturing process will be described.

Figure 16:
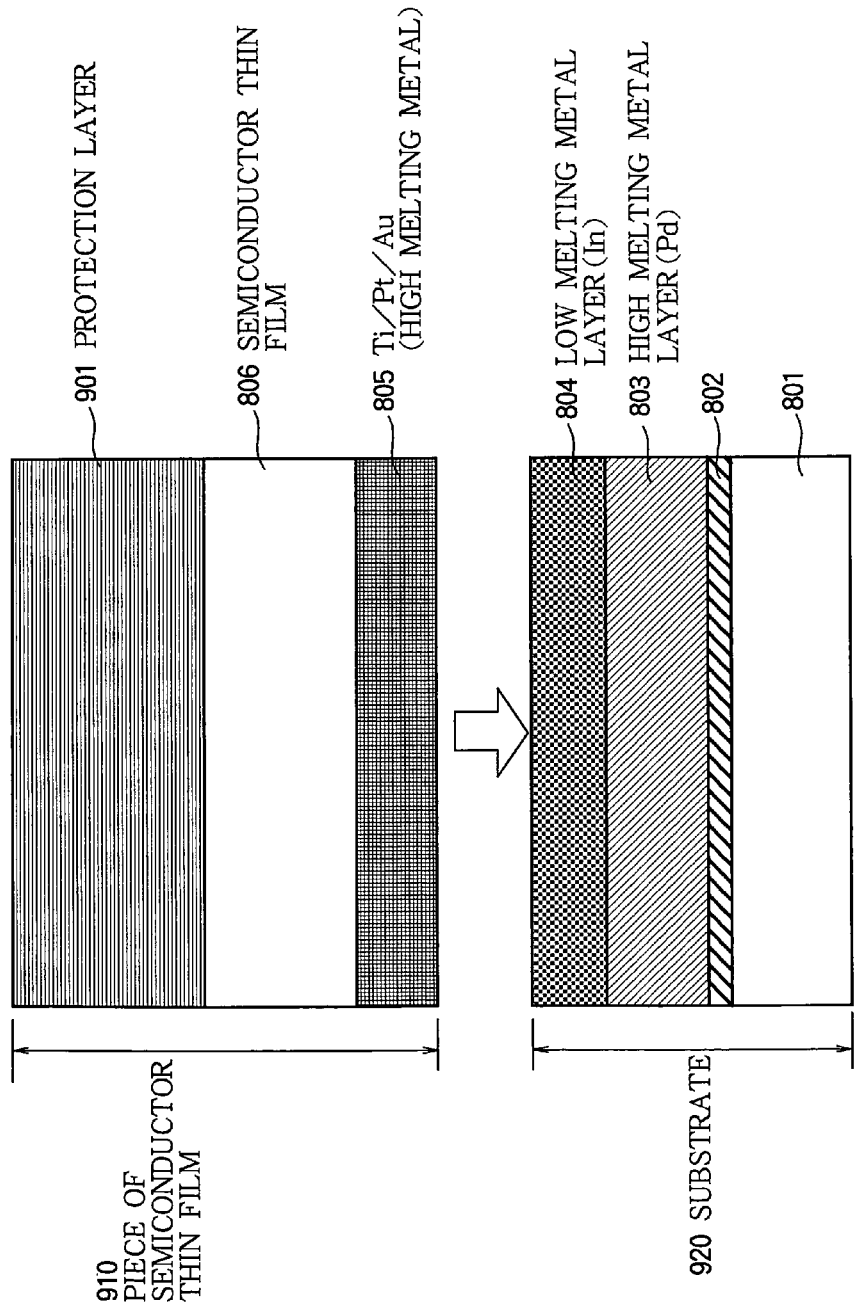
FIGS. 16 and 17 illustrate the outline of a manufacturing process.
Figure 17:
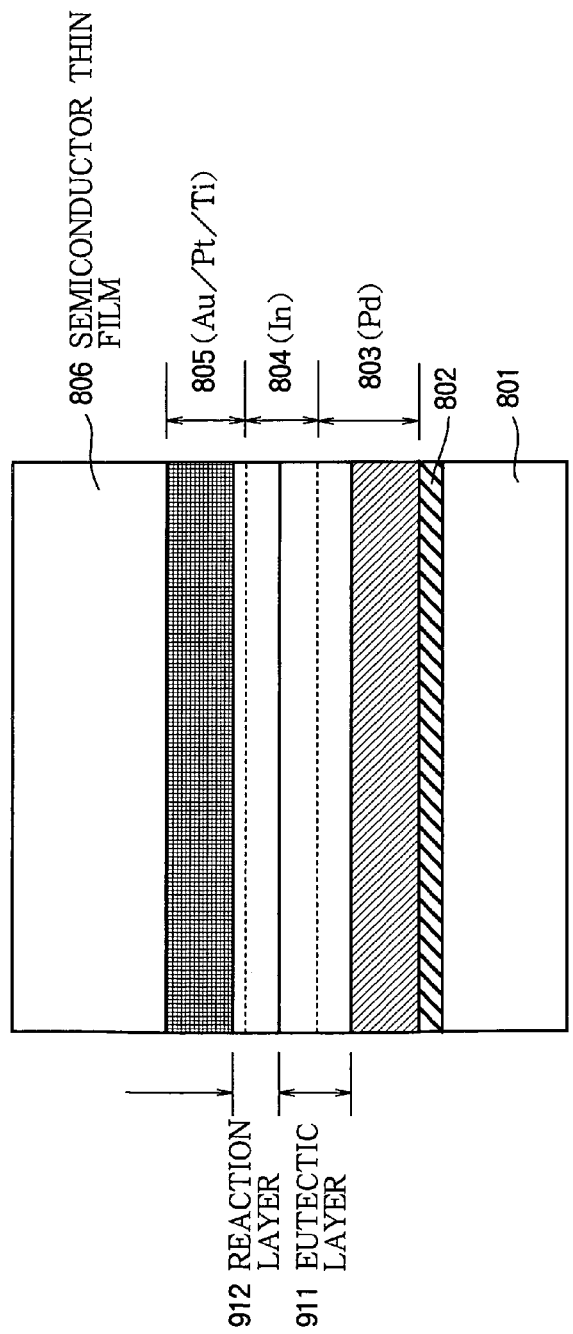

FIGS. 16 and 17 illustrate the outline of the manufacturing process.

Referring to FIG. 16, a piece of semiconductor thin film 910 includes the semiconductor thin film 806, a protection layer 901 that supports and/or protects the semiconductor thin film 806 thereon, and the metal layer 805 formed on the backside of the semiconductor thin film 806. A substrate 920 onto which the semiconductor thin film 806 is to be bonded includes, for example, the Si substrate 801, Cr metal layer 802, high-melting-point metal layer (Pd) 803, and low-melting-point metal layer (In) 804.

FIG. 17 illustrates the piece of semiconductor thin film 910 and the substrates 920 after they have been bonded together and the support 901 has been removed from the semiconductor thin film 806. After the piece of semiconductor thin film 910 has been bonded onto the substrate 920, or after the piece of semiconductor thin film 910 has been bonded onto the substrate 920 and the support 901 has been removed from the semiconductor thin film 806, the structure is heated so that the metal layers 803, 804, and 805 react with each other at their interfaces until no portion of the low-melting-point metal layer 804 will remain unreacted. For the combination of the high-melting-point metal layer (Pd) 803, low-melting-point metal layer (In) 804, and metal layer (Au/Pt/Ti) 805, the structure in FIG. 17 is heated at 150° C. for 0.5 hour.

As described above, a semiconductor thin film according to the second embodiment has the metal layer 805 formed thereon, the metal layer 805 making ohmic contact with the low-melting-point metal layer 804. This is advantageous in that the metal layer 805 reacts with the low-melting-point metal layer 804 for good bonding effect, and provides good adhesion to semiconductor thin film 806 so that the contact resistance between the metal layer 805 and the surface of the semiconductor thin film 806 can be small.

Modifications to the second embodiment will be described.

While the low-melting-point metal layer 804 has been described in terms of In, the low-melting-point metal layer 804 may also be selected from the group consisting of Sn, Tl, Ce, and Bi. While the high-melting-point metal layer 803 has been described in terms of Pd, the material for the high-melting-point metal layer 803 may be selected from the group consisting of Au, Ag, and Ni. Still alternatively, the high-melting-point metal layer 803 may be a layer that contains one of Au, Ag, and Ni. Likewise, while the metal layer 805 has been described with respect to a metal layer that contains Au, the metal layer 805 may be formed of a material selected from the group consisting of Pd, Ag, Ni, Ge, NiGe, AuGeNi, and Al. Still alternatively, the metal layer 805 may be a layer that contains one of Pd, Ag, Ni, Ge, NiGe, AuGeNi, and Al. The surface portion of the metal layer 805 in direct contact with the low-melting-point metal layer 804 may be In.

The second embodiment has been described in terms of an Si substrate and a compound semiconductor thin film formed on the Si substrate. The materials for the substrate and semiconductor thin film are not limited to those described in the second embodiment. The Si substrate may be replaced by a transparent substrate such as a glass substrate, a quartz substrate, or a sapphire substrate. Still alternatively, the Si substrate may be replaced by a ceramic substrate, plastic substrate, or a metal substrate. Although the semiconductor thin film was made of AlGaAs/GaAs materials, the semiconductor thin film may also be made of an AlGaInP/GaAs semiconductor or a GaInAsP/InP semiconductor. Further, the semiconductor thin film may be a nitride semiconductor such as an InGaN/GaN semiconductor. Yet alternatively, the semiconductor thin film may be formed of a semiconductor material such as Si. Further, instead of selectively etching the semiconductor thin film into, for example, a plurality of LEDs, the semiconductor thin film may also be selectively diffused to form desired semiconductor elements. Instead of a double hetero structure, the semiconductor structure may be a single hetero structure or a homo-structure. The light-emitting elements may be lasers instead of LEDs. Moreover, the semiconductor elements are not limited to light-emitting elements but may be light-receiving elements or some other semiconductor elements.

Third Embodiment

A third embodiment relates to the surface treatment of the exposed surface of a low-melting-point metal performed prior to the bonding of the semiconductor substrate onto another substrate different from the semiconductor substrate. The exposed surface of the low-melting-point metal is irradiated with, for example, $N_2$ plasma or Ar plasma in vacuum or under atmospheric pressure to remove an oxide film from the surface. Then, the surfaces are placed together in intimate contact with each other in vacuum or in an atmosphere of inert gas (e.g., $N_2$ gas) in which the materials are prevented from being oxidized. Then, the structure is heated to a temperature higher than the melting point of the low-melting-point metal so that the metals react with each other. Materials that activate the surface of the low-melting-point metal may be used to activate the surface, thereby performing a bonding operation. Such materials are, for example, amines such as ethanolamine to which a fluoroborate is added. Other materials such as halogenides may also be used for activating the surface.

According to the third embodiment, the oxide film that covers the surface of the low-melting-point metal is removed, thereby providing uniform, good bonding.

Figure 18:
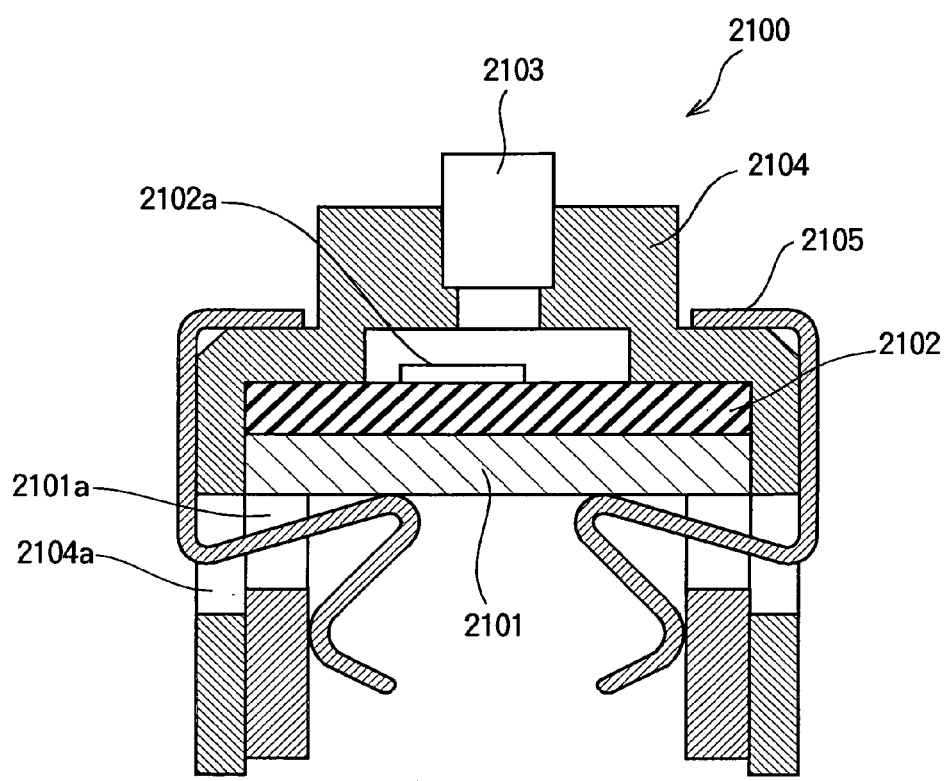
FIG. 18 is a cross-sectional view of an LED head on which a semiconductor device according to the invention is mounted.

FIG. 18 is a cross-sectional view of an LED head on which a semiconductor device according to the invention is mounted. Referring to FIG. 18, an LED head 2100 includes a base member 2101 and an LED unit 2102 fixed on the base member 2101. The LED unit 2102 employs any one of the LED/driver composite chips described in the first and second embodiments. Thus, a light emitting region 2102a corresponds to an LED epi-film of the first and second embodiments. A rod lens array 2103 is disposed over the light emitting region 2102a to focus the light emitted from the light-emitting region 2102a. The rod lens array 2103 includes a plurality of rod-shaped optical lenses aligned along a straight line of light-emitting regions 2102a. The rod lens array 2103 is supported by a lens holder 2104 in position. The base member 2101 and holder 2104 are formed with openings 2101a and 2104a, respectively.

The base member 2101, LED unit 2102, and lens holder 2104 are held together in a unitary construction by clampers 2105 that extend through the openings 2101a and 2104a.

Thus, the light emitted from the LED unit 2102 passes through the rod lens array 2103 to an external member, not shown. This LED head 2100 is used as an exposing unit for, for example, an electrophotographic image forming apparatus and an electrophotographic copying machine.

With the aforementioned LED head 2100, the LED unit 2102 takes the form of one of the LED/driver IC composite chips mentioned in the first and second embodiments. Thus, the LED head 2100 is a compact, high-quality, and very low-cost LED head.

Figure 19:
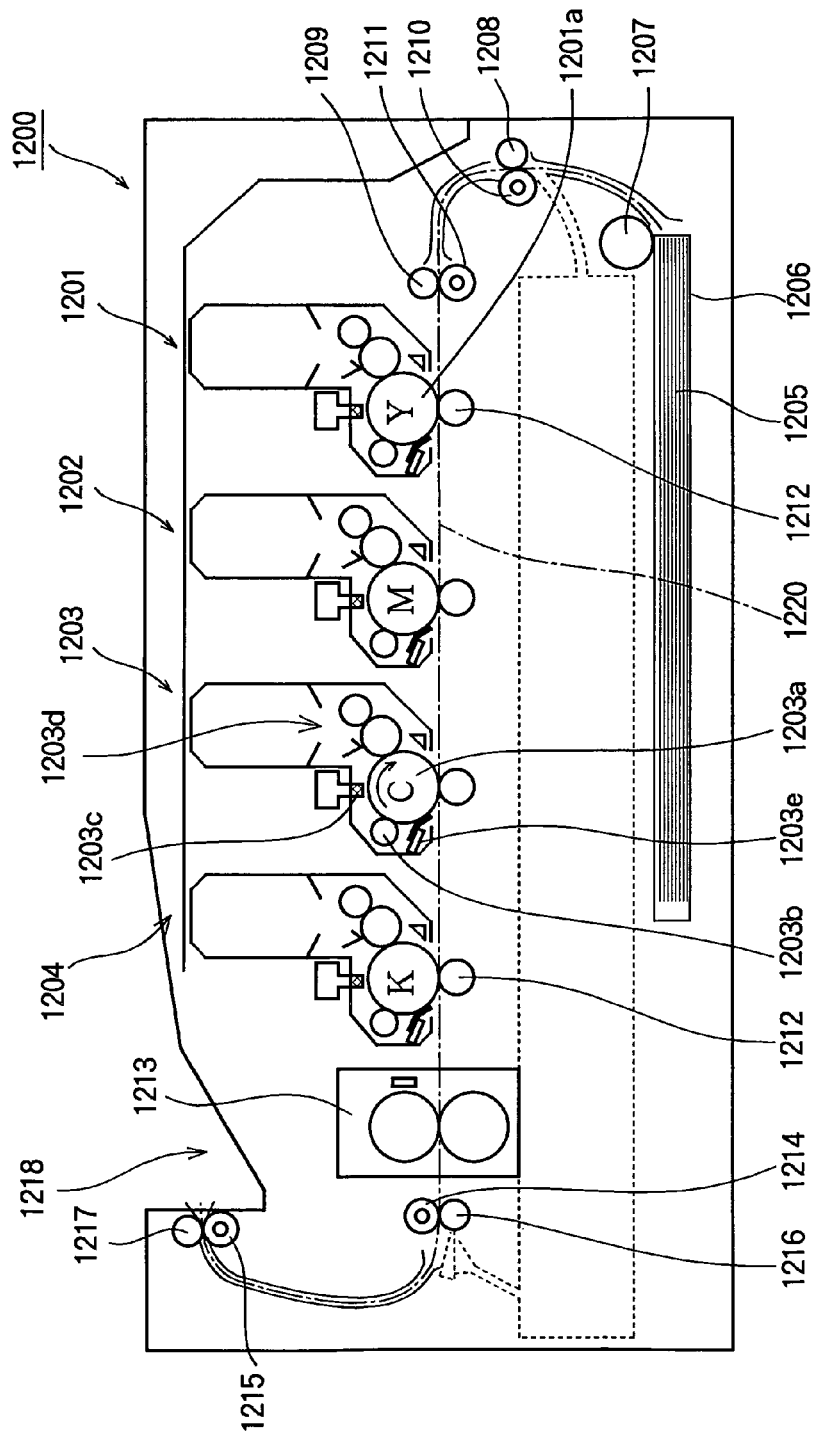
FIG. 19 is a schematic cross-sectional view illustrating an image forming apparatus that employs an LED head equipped with the semiconductor apparatus according to the invention.
Figure 20A:
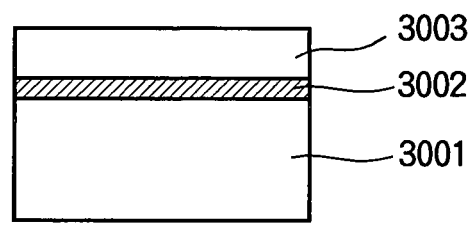
FIGS. 20A and 20B illustrate a conventional semiconductor device.
Figure 20B:
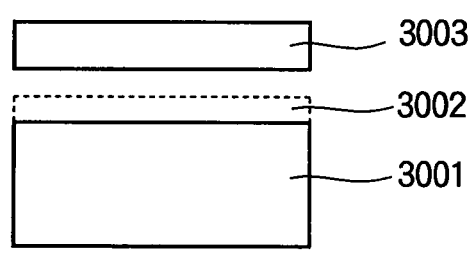

FIG. 19 is a schematic cross-sectional view illustrating an image forming apparatus that employs an LED head equipped with the semiconductor apparatus according to the invention.

Referring to FIG. 19, an image forming apparatus 1200 includes process units 1201-1204 that form yellow, magenta, cyan, and black images, respectively. The process units 1201-1204 are aligned from upstream to downstream along a transport path in which a recording medium 1205 is transported. Each of the process units 1201-1204 may be substantially identical; for simplicity only the operation of the process unit 1203 for forming cyan images will be described, it being understood that the other process units 1201, 1202, and 1204 may work in a similar fashion.

The process unit 1203 includes a photoconductive drum 1203a that rotates in a direction shown by arrow A. Disposed around the photoconductive drum 1203a are a charging unit 1203b and an exposing unit 1203c aligned in this order with respect to rotation of the photoconductive drum 1203a. The charging unit 1203b charges the surface of the photoconductive drum 1203a. The exposing unit 1203c selectively illuminates the charged surface of the photoconductive drum 1203a in accordance with print data to form an electrostatic latent image. Disposed downstream of the exposing unit 1203c is a developing unit 1203d that supplies cyan toner to the electrostatic latent image formed on the photoconductive drum 1203a. Disposed further downstream of the developing unit 1203d is a cleaning unit 1203e that removes residual toner remaining on the surface of the photoconductive drum 1203a after transferring a toner image onto the recording medium 1205. The drum and/or rollers used in the respective units are driven in rotation by a drive source, not shown, through gears.

A paper cassette 1206 is attached to a lower area of the image forming apparatus 1200, holding a stack of recording medium 1205 such as paper therein. A hopping roller 1207 is disposed above the paper cassette 1206 to feed the recording medium 1205 on a page-by-page basis into the transport path of the recording medium 1205. A transport roller 1210 and pinch roller 1208 are provided downstream of the hopping roller 1207 with respect to the direction of transport of the recording medium 1205. The transport roller 1210 and pinch roller 1208 transport the recording medium 1205 while holding the page of the recording medium 1205 between them in a sandwiched relation. A registration roller 1211 and pinch roller 1209 are disposed downstream of the transport roller 1210 and pinch roller 1208, and cooperate with each other to avoid skew of the recording medium 1205, and then further transport the recording medium 1205. The hopping roller 1207, transport roller 1210, and registration roller 1211 are driven in rotation by a drive source, not shown, through gears.

Transfer rollers 1212 are formed of an electrically conductive rubber material and are disposed to oppose the photoconductive drums of the process units 1201-1204. The transfer rollers 1212 receive a high voltage to create a difference in potential between the surface potential of the photoconductive drums 1201a-1204a and the transfer rollers 1212.

A fixing unit 1213 includes a heat roller and a backup roller which apply heat and pressure to the recording medium 1205 to fuse the toner image into a permanent image. The discharge rollers 1214 and 1215 cooperate with pinch rollers 1216 and 1217 to hold the recording medium 1205 between them in a sandwiched relation and discharge the recording medium onto a stacker 1218. The fixing unit 1213 and discharge rollers 1214 are driven in rotation by a drive source, not shown, through gears. The exposing unit 1203c takes the form of the aforementioned LED head 2100 in FIG. 16.

The operation of the image forming apparatus with the aforementioned configuration will be described. The hopping roller 1207 separates the top page of the stack of recording medium 1205 from the rest, and then feeds the top page into the transport path. Subsequently, the recording medium 1205 is held between the transport roller 1210, registration roller 1211, and pinch rollers 1208 and 1209 in a sandwiched relation, and passes through a transfer point defined between the photoconductive drum 1201a and the transfer roller 1212. As the photoconductive drum 1201a rotates, the recording medium 1205 advances through the transfer point, so that the toner image is transferred onto the recording medium 1205.

The exposing units 1201c-1204c forms electrostatic latent images of corresponding colors, and the developing unit 1201d-1204d develop the electrostatic latent images into toner images of corresponding colors. As the recording medium 1205 passes through the transfer points of the process units 1202-1204, the toner images of the respective colors are transferred one over the other in registration. The recording medium 1205 enters the fixing unit 1213 for fusing the toner images, and leaves the fixing unit 1203 after fusing. Then, the recording medium 1205 advances while being held between the discharge rollers 1214 and 1215 and pinch rollers 1216 and 1217, and is finally discharged onto the stacker 1218 outside of the image forming apparatus 1200.

Employing the aforementioned LED head 2100, the image forming apparatus of the present invention provides efficient utilization of space, high print quality, and low manufacturing costs.

The advantages of efficient utilization of space and low manufacturing cost are also applicable not only to full-color printers and copying machines but also to monochrome printers, multicolor printers, and copying machines. In particular, the advantages are very prominent when the present invention is applied to full-color printers that employ a plurality of exposing units.

What is claimed is:

1. A method of manufacturing a semiconductor composite apparatus, comprising the steps of:
    preparing a semiconductor thin film;
    preparing a laminated substrate that includes a high-melting-point metal layer on a surface of a base substrate and a low-melting-point metal layer formed in contact with the high-melting-point metal layer;
    placing the semiconductor thin film directly on the low-melting-point metal layer; and
    heating the low-melting-point metal layer to melt at a temperature higher than a melting point of the low-melting-point metal layer but lower than a melting point of the high-melting-point metal layer.

2. The method according to claim 1, wherein said low-melting-point metal layer is selected from the group consisting of In, Sn, Bi, Ce, and Tl.

3. The method according to claim 1, wherein said high-melting-point metal layer is formed of one selected from the group consisting of Au, Pd, and Ni.

4. The method according to claim 1, wherein said semiconductor thin film includes light emitting elements formed therein.

5. The method according to claim 1, wherein the low-melting-point metal layer provides adhesion to the semiconductor thin film to minimize a contact resistance between the low-melting-point metal layer and the semiconductor thin film.

6. The method according to claim 1, wherein the low-melting-point metal layer melts to react with the high-melting-point metal, producing an alloy layer of the low-melting-point metal and the high-melting-point metal.

7. The method according to claim 6, wherein the high-melting-point metal layer is sandwiched between said alloy layer and said base substrate; and wherein a portion of said high-melting-point metal layer, which forms said high-melting-point metal layer remains unreacted with the low-melting-point metal.

8. The method according to claim 7, wherein the alloy layer has a higher melting point than the low-melting-point metal layer.

9. The method according to claim 7, wherein the alloy layer contains one selected from the group consisting of $Au_xIn_y$, $Pd_xIn_y$, and $Ni_xIn_y$.

10. The method according to claim 1, wherein the semiconductor thin film further includes:
    an AlGaAs layer including a first side facing the low-melting-point metal layer and a second side opposite to the first side; and
    a GaAs layer on the first side of the AlGaAs layer.

11. The method according to claim 1, wherein the semiconductor thin film further includes:
    an AlGaAs layer including a first side facing the low-melting-point metal layer and a second side opposite to the first side; and
    a GaAs layer on the second side of the AlGaAs layer.

* * * * *